(12) United States Patent
Hirose et al.

(10) Patent No.: US 7,553,747 B2
(45) Date of Patent: Jun. 30, 2009

(54) SCHOTTKY DIODE HAVING A NITRIDE SEMICONDUCTOR MATERIAL AND METHOD FOR FABRICATING THE SAME

(75) Inventors: Yutaka Hirose, Kyoto (JP); Tsuyoshi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 262 days.

(21) Appl. No.: 11/495,454

(22) Filed: Jul. 31, 2006

(65) Prior Publication Data
US 2007/0029633 A1    Feb. 8, 2007

(30) Foreign Application Priority Data
Aug. 5, 2005    (JP)    ............... 2005-228690

(51) Int. Cl.
*H01L 29/74* (2006.01)
(52) U.S. Cl. ...................... 438/579; 438/574
(58) Field of Classification Search ................ 257/94, 257/449; 438/574, 576, 579
See application file for complete search history.

(56) References Cited

U.S. PATENT DOCUMENTS 7,002,187 B1 * 2/2006 Husher ................ 257/109

2006/0108606 A1 * 5/2006 Saxler et al. ................ 257/200

FOREIGN PATENT DOCUMENTS

| JP | 60-10653 A | | 1/1985 |
| JP | 63311762 A | * | 12/1988 |
| JP | 5-167064 A | | 7/1993 |

OTHER PUBLICATIONS

Guo et al. "Study of Schottky barriers on n-type GaN grown by low-pressure metalorganic chemical vapor deposition," Appl. Phys. Lett. 67, 2657 (1995).*

Akira Itoh, "Excellent Reverse Blocking Characteristics of High0Voltage 4H-SiC Schottky Rectifiers with Boron-Implanted Edge Termination," IEEE Electron Device Letters, 1996, pp. 139-141, vol. 17, No. 3.

* cited by examiner

*Primary Examiner*—Thomas L Dickey
(74) *Attorney, Agent, or Firm*—McDermott Will & Emery LLP

(57) ABSTRACT

A Schottky diode includes a first nitride semiconductor layer formed on a substrate and a second nitride semiconductor layer selectively formed on the first nitride semiconductor layer and having a different conductivity type from that of the first nitride semiconductor layer. A Schottky electrode is selectively formed on the first nitride semiconductor layer to come into contact with the top surface of the second nitride semiconductor layer, and an ohmic electrode is formed thereon so as to be spaced apart from the Schottky electrode.

2 Claims, 4 Drawing Sheets

SCHOTTKY DIODE HAVING A NITRIDE SEMICONDUCTOR MATERIAL AND METHOD FOR FABRICATING THE SAME

CROSS-REFERENCE TO RELATED APPLICATIONS

The disclosure of Japanese Patent Application No. 2005-228690 filed on Aug. 5, 2005 including specification, drawings and claims is incorporated herein by reference in its entirety.

BACKGROUND OF THE INVENTION (1) Field of the Invention

The present invention relates to Schottky diodes using a nitride semiconductor material and fabrication methods for the same.

(2) Description of Related Art

Schottky diodes are basic electronic devices and used for various circuits, such as rectifier circuits, inverter circuits and chopper circuits. The electrical characteristics demanded of Schottky diodes include a high breakdown voltage. With a reduction in the size of power supply circuits and an increase in the capacitance thereof, higher-breakdown-voltage Schottky diodes have been demanded.

Disclosed as a method for enhancing the breakdown voltage of a Schottky diode is a method in which, for example, when a Schottky electrode is formed on an n-type semiconductor layer, a p-type region is formed in a region of an n-type semiconductor layer coming into contact with the lower end of the Schottky electrode by ion implantation (see, for example, A. Itoh et al. IEEE ELECTRON DEVICE LETTERS, Vol. 17, No. 3 (1996) pages 139-141). This structure can reduce the field crowding at the lower end of the Schottky electrode, resulting in an enhanced breakdown voltage.

Meanwhile, Group III-V nitride semiconductor materials composed of a compound of aluminum (Al), boron (B), gallium (Ga), or indium (In) and nitride (N) represented by a general formula of $B_wAl_xGa_yIn_zN$ (wherein $w+x+y+z=1$ and $0 \leq w, x, y, z \leq 1$) have a large bandgap. Therefore, the nitride semiconductor materials are suitable as materials of high-breakdown-voltage elements. It is expected that the use of a nitride semiconductor material for Schottky diodes will provide higher-breakdown-voltage Schottky diodes.

However, if an attempt is made to use a nitride semiconductor material for a Schottky diode of a known structure, process steps for fabricating such a Schottky diode will become complicated and the fabrication of such a Schottky diode will cost high. To be specific, in order to provide a known Schottky diode, ions must be implanted into a nitride semiconductor layer to form a P-type region. This necessitates complicated process steps, such as formation of a mask, ion implantation, removal of a resist, and annealing. In order to allow Schottky diodes to have the same characteristics, the depth to which ions are implanted into the nitride semiconductor layer must be accurately controlled.

SUMMARY OF THE INVENTION

The present invention is made to solve the known problems, and its objective is to achieve a high-breakdown-voltage Schottky diode using a nitride semiconductor material without undergoing complicated process steps, such as ion implantation.

To be specific, a Schottky diode according to a first aspect of the present invention includes: a first nitride semiconductor layer formed on a substrate; a second nitride semiconductor layer selectively formed on the first nitride semiconductor layer and having a different conductivity type from that of the first nitride semiconductor layer; a Schottky electrode selectively formed on the first nitride semiconductor layer and coming into contact with the top surface of the second nitride semiconductor layer; and an ohmic electrode formed on the first nitride semiconductor layer so as to be spaced apart from the Schottky electrode.

According to the Schottky diode of the first aspect, the second nitride semiconductor layer having a different conductivity type from that of the first nitride semiconductor layer can be formed by a usual process in which a semiconductor layer is deposited on a substrate and then the semiconductor layer is selectively etched. In view of the above, ion implantation does not need to be carried out in formation of the second nitride semiconductor layer having a different conductivity type from that of the first nitride semiconductor layer. This can simplify process steps for fabricating a Schottky diode. A part of the Schottky electrode located on the second nitride semiconductor layer functions as a field plate. Therefore, the Schottky diode of the first aspect functions as a high-breakdown-voltage Schottky diode. As a result, a high-breakdown-voltage Schottky diode can be easily achieved.

In this case, it is preferable that the first nitride semiconductor layer is configured to have a layered structure including a heavily-doped layer which is partly exposed and the ohmic electrode is formed on the exposed part of the heavily-doped layer. This structure can reduce the contact resistance of the ohmic electrode.

A Schottky diode according to a second aspect of the present invention includes: a first nitride semiconductor layer formed on a conductive substrate; a second nitride semiconductor layer selectively formed on the first nitride semiconductor layer and having a different conductivity type from that of the first nitride semiconductor layer; a Schottky electrode selectively formed on the first nitride semiconductor layer and coming into contact with the top surface of the second nitride semiconductor layer; and an ohmic electrode coming into contact with the substrate.

According to the Schottky diode of the second aspect, the effect of the Schottky diode of the first aspect can also be achieved, and furthermore the contact resistance of the ohmic electrode can be reduced.

In this case, it is preferable that the first nitride semiconductor layer is formed to expose a part of the substrate and the ohmic electrode is formed on the exposed part of the substrate.

A method for fabricating a Schottky diode according to the present invention includes the steps of: (a) forming a first nitride semiconductor layer on a substrate; (b) forming, on the first nitride semiconductor layer, a second nitride semiconductor layer having a different conductivity type from that of the first nitride semiconductor layer and selectively etching the formed second nitride semiconductor layer, thereby removing part of the second nitride semiconductor layer and thus exposing associated part of the first nitride semiconductor layer; and (c) selectively forming a conductive film on the first nitride semiconductor layer to form a Schottky electrode, said conductive film coming into contact with the top surface of the second nitride semiconductor layer.

According to the method of the present invention, a region of the Schottky diode having a different conductivity type from that of the first nitride semiconductor layer can be formed without undergoing ion implantation. This can simplify process steps for fabricating a Schottky diode. Since the method includes the step of selectively forming a conductive film on the first nitride semiconductor layer to come into contact with the top surface of the second nitride semiconductor layer, a part of the Schottky electrode located on the second nitride semiconductor layer functions as a field plate. This can enhance the breakdown voltage of the Schottky diode. As a result, a high-breakdown-voltage Schottky diode can be easily achieved.

It is preferable that the method of the present invention further includes the step of after the step (b), forming an ohmic electrode on a different part of the first nitride semiconductor layer from a part thereof on which the second nitride semiconductor layer is formed.

It is preferable that the method of the present invention further includes the steps of after the step (b), selectively removing a part of the first nitride semiconductor layer to expose an associated part of the substrate, and forming an ohmic electrode on the exposed part of the substrate, the substrate being conductive.

DETAILED DESCRIPTION OF THE INVENTION

Embodiment

Figure 1:
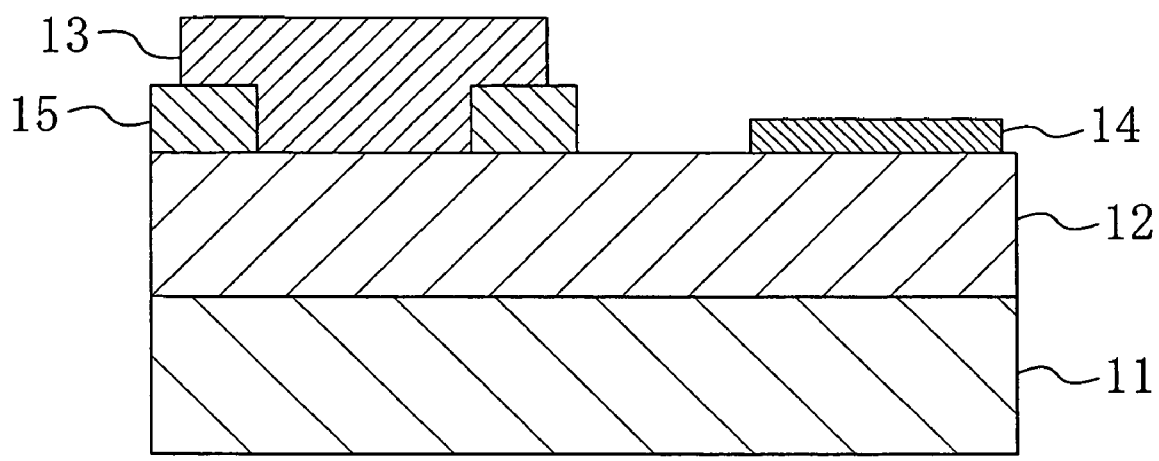
FIG. 1 is a cross-sectional view illustrating a Schottky diode according to an embodiment of the present invention.

An embodiment of the present invention will be described with reference to the drawings. FIG. 1 illustrates a cross-sectional structure of a Schottky diode according to an embodiment of the present invention. As illustrated in FIG. 1, a first nitride semiconductor layer 12 of n-type gallium nitride (GaN) is formed on a substrate 11 of sapphire. A second nitride semiconductor layer 15 of p-type GaN is selectively formed on the first nitride semiconductor layer 12. A Schottky electrode 13 is formed to come into contact with the top surface of the second nitride semiconductor layer 15 and the first nitride semiconductor layer 12. An ohmic electrode 14 is formed on the first nitride semiconductor layer 12 so as to be spaced apart from the Schottky electrode 13, thereby forming an ohmic junction with the first nitride semiconductor layer 12.

In the Schottky diode of this embodiment, a part of the Schottky electrode 13 is formed on the second nitride semiconductor layer 15. The part of the Schottky electrode 13 located on the second nitride semiconductor layer 15 functions as a field plate for a region of the first nitride semiconductor layer 12 coming into contact with a lower edge part of the Schottky electrode 13. This can reduce the field crowding at the region of the first nitride semiconductor layer 12 coming into contact with the lower edge part of the Schottky electrode 13.

Furthermore, a depletion layer is formed at the interface between the second nitride semiconductor layer 15 and the first nitride semiconductor layer 12. A part of the Schottky electrode 13 located on the second nitride semiconductor layer 15 has a much higher breakdown voltage as compared with a case where a Schottky electrode 13 alone is formed on the first nitride semiconductor layer 12.

A fabrication method for a Schottky diode according to this embodiment will be described hereinafter with reference to the drawings. FIGS. 2A through 2D illustrate process steps in the fabrication method for a Schottky diode according to this embodiment step by step.

Figure 2A:
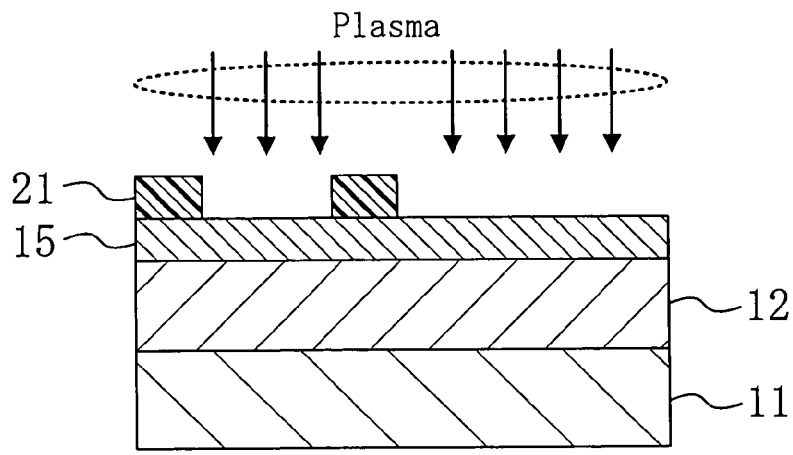
FIGS. 2A through 2D are cross-sectional views illustrating process steps in a fabrication method for a Schottky diode according to the embodiment of the present invention step by step.

First, as illustrated in FIG. 2A, a first nitride semiconductor layer 12 of GaN containing n-type impurities is grown on a substrate 11 made of sapphire or any other material by metal organic chemical vapor deposition (MOCVD). Subsequently, a second nitride semiconductor layer 15 of GaN containing p-type impurities is grown on the first nitride semiconductor layer 12. Subsequently, a resist mask 21 is formed on the second nitride semiconductor layer 15, and then the second semiconductor layer 15 is subjected to dry etching using a chlorine-based gas.

Figure 2B:
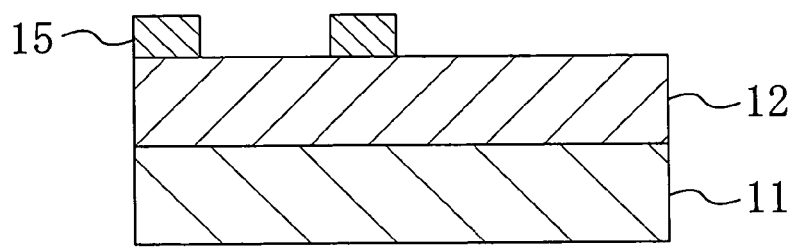

In the above-mentioned manner, as illustrated in FIG. 2B, the second nitride semiconductor layer 15 is selectively removed while its region on the top surface of which a Schottky electrode 13 is to be formed is left. In this way, the first nitride semiconductor layer 12 is exposed.

Figure 2C:
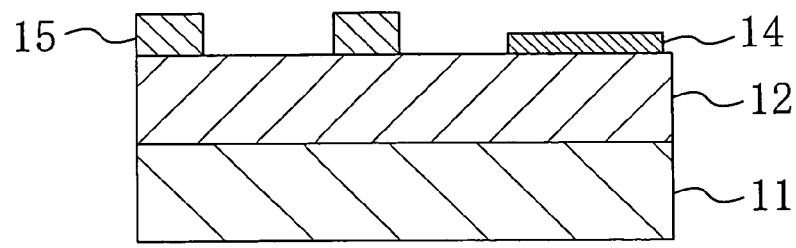

Next, as illustrated in FIG. 2C, an ohmic electrode 14 is formed, by vapor deposition or any other method, on a different region of the first nitride semiconductor layer 12 from a region thereof on which the second nitride semiconductor layer 15 is formed. In this embodiment, the ohmic electrode 14 is made of a layered film of titanium and aluminum.

Figure 2D:
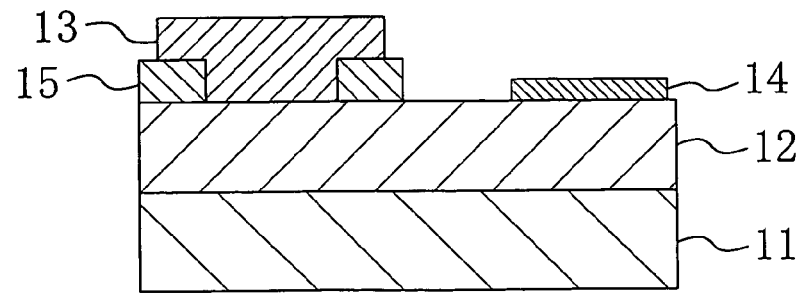

Next, as illustrated in FIG. 2D, a Schottky electrode 13 is formed by vacuum deposition or any other method to come into contact with the top surface of the second nitride semiconductor layer 15 and the first nitride semiconductor layer 12. The Schottky electrode 13 is made of palladium, nickel or any other material.

According to the fabrication method for a Schottky diode of this embodiment, ion implantation does not need to be carried out. This can sharply reduce the number of process steps as compared with the known art, resulting in a high-breakdown-voltage Schottky diode provided at low cost.

Figure 3:
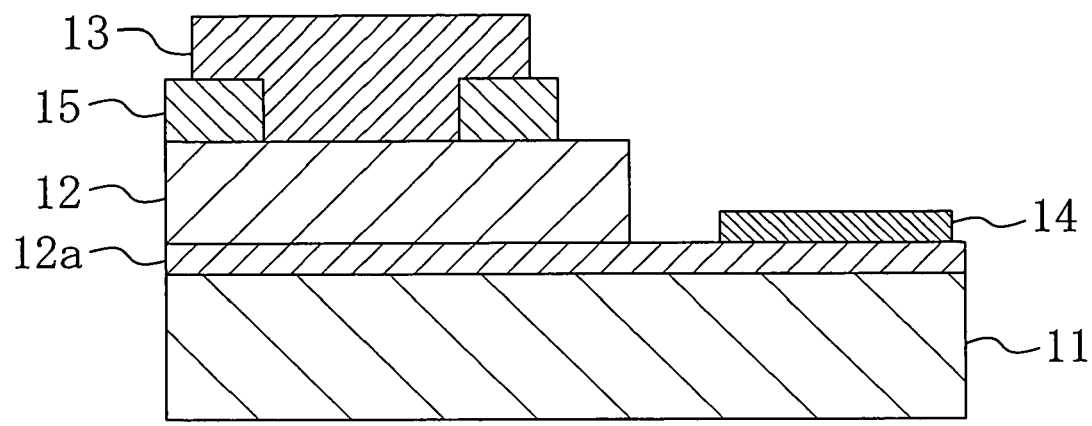
FIG. 3 is a cross-sectional view illustrating another Schottky diode according to the embodiment of the present invention.

As illustrated in FIG. 3, a first nitride semiconductor layer 12 may have a layered structure including a heavily-doped layer 12a, and an ohmic electrode 14 may be formed on the heavily-doped layer 12a. This structure can reduce the contact resistance of an ohmic electrode.

Variant of Embodiment

Figure 4:
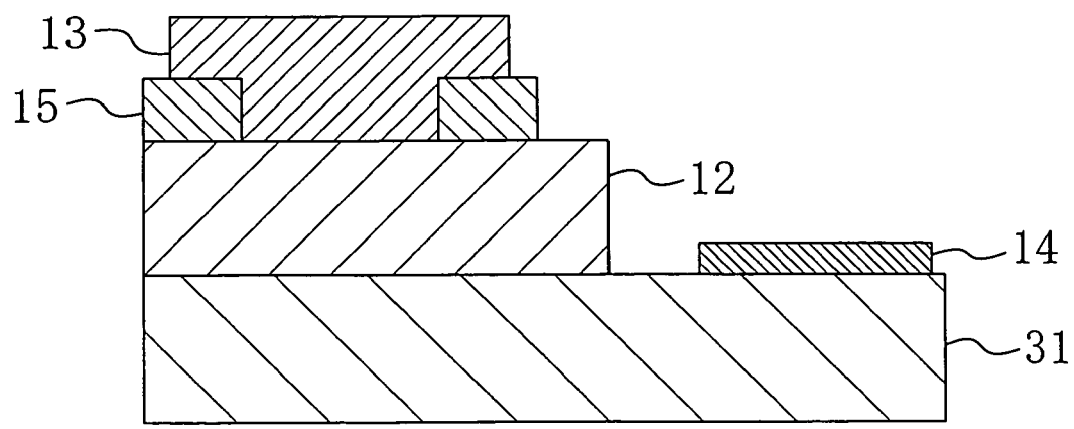
FIG. 4 is a cross-sectional view illustrating a Schottky diode according to a variant of the embodiment of the present invention.

A variant of the embodiment of the present invention will be described hereinafter with reference to the drawings. FIG. 4 illustrates a cross-sectional structure of a Schottky diode according to this variant. In FIG. 4, the same components as illustrated in FIG. 1 are denoted by the same reference numerals, and therefore description thereof will be omitted.

As illustrated in FIG. 4, the Schottky diode of this variant uses a conductive substrate of silicon as a substrate 31. An ohmic electrode 14 is formed not on a first nitride semiconductor layer 12 but on the conductive substrate 31.

The formation of the ohmic electrode 14 on the substrate 31 can reduce the contact resistance thereof. This allows the insertion loss of the Schottky diode to become small.

FIGS. 5A through 5D illustrate process steps in a fabrication method for a Schottky diode according to this variant step by step. In FIGS. 5A through 5D, the same components as shown in FIGS. 2A through 2D are denoted by the same reference numerals, and therefore description thereof will be omitted.

Figure 5A:
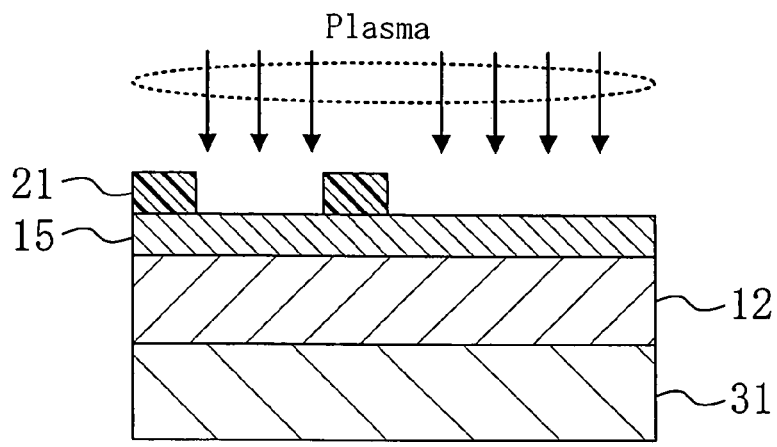
FIGS. 5A through 5D are cross-sectional views illustrating process steps in a fabrication method for a Schottky diode according to the variant of the embodiment of the present invention step by step.

First, as illustrated in FIG. 5A, a first nitride semiconductor layer 12 of GaN containing n-type impurities is grown on a conductive substrate 31 of silicon or any other material by MOCVD. Subsequently, a second nitride semiconductor layer 15 of GaN containing p-type impurities is grown on the first nitride semiconductor layer 12. Subsequently, a resist mask 21 is formed on the second nitride semiconductor layer 15, and then the second nitride semiconductor layer 15 is subjected to dry etching using a chlorine-based gas. In this manner, the second nitride semiconductor layer 15 is selectively removed to expose part of the first nitride semiconductor layer 12.

Figure 5B:
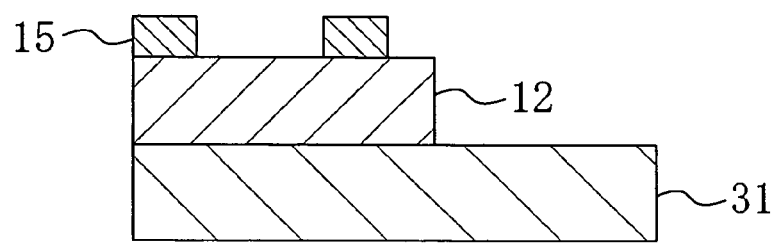

Next, as illustrated in FIG. 5B, another resist mask (not shown) covers a region of the first nitride semiconductor layer 12 on which a Schottky electrode 13 is to be formed. Thereafter, the first nitride semiconductor layer 12 is selectively removed to expose part of the substrate 31.

Figure 5C:
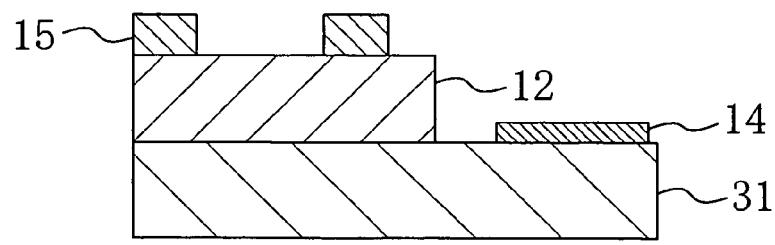

Next, as illustrated in FIG. 5C, an ohmic electrode 14 is formed on the exposed part of the substrate 31.

Figure 5D:
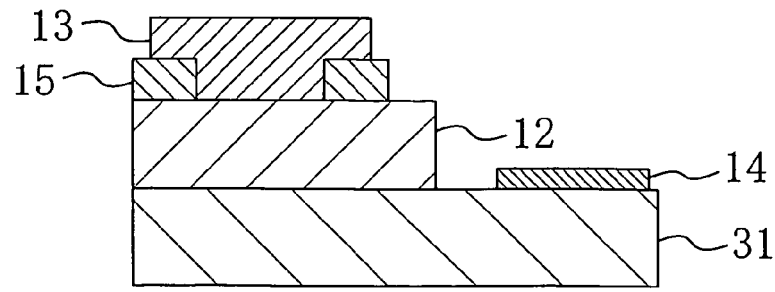

Next, as illustrated in FIG. 5D, a Schottky electrode 13 is formed to come into contact with the top surface of the second nitride semiconductor layer 15 and the first nitride semiconductor layer 12.

In this variant, the ohmic electrode 14 is formed on the top surface of a part of the substrate 31 exposed by removing part of the first nitride semiconductor layer 12. However, it may be formed on the bottom surface of the substrate 31.

As described above, the Schottky diode and the fabrication method for the same of the present invention are useful as a Schottky diode using a nitride semiconductor and a fabrication method for the same, because they can provide a high-breakdown-voltage Schottky diode using a nitride semiconductor without undergoing complicated process steps, such as ion implantation.

What is claimed is:

1. A method for fabricating a Schottky diode, said method comprising the steps of:
    (a) forming a first nitride semiconductor layer, and subsequently, a second nitride semiconductor layer having a different conductivity type from that of the first nitride semiconductor layer on a substrate;
    (b) selectively etching the formed second nitride semiconductor layer, thereby removing part of the second nitride semiconductor layer and thus exposing associated part of the first nitride semiconductor layer;
    (c) selectively forming a conductive film on the first nitride semiconductor layer to form a Schottky electrode, said conductive film coming into contact with the top surface of the second nitride semiconductor layer;
    (d) after the step (b), selectively removing a part of the first nitride semiconductor layer to expose an associated part of the substrate; and
    (e) forming an ohmic electrode on the exposed part of the substrate,
    the substrate being conductive.

2. The method of claim 1 further comprising the step of after the step (b), forming an ohmic electrode on a different part of the first nitride semiconductor layer from a part thereof on which the second nitride semiconductor layer is formed.

* * * * *